United States Patent [19]

Abe et al.

[11] Patent Number: 4,553,059
[45] Date of Patent: Nov. 12, 1985

[54] PIEZOELECTRIC ACTUATOR AND A PIEZOELECTRIC PUMP INJECTOR INCORPORATING THE SAME

[75] Inventors: Seiko Abe, Okazaki; Yasuyuki Sakakibara, Nishio; Masahiro Tomita, Anjyo; Kazuo Shinoda, Toyota, all of Japan

[73] Assignee: Nippon Soken, Inc., Nishio, Japan

[21] Appl. No.: 654,676

[22] Filed: Sep. 26, 1984

[30] Foreign Application Priority Data

Nov. 10, 1983 [JP] Japan ................... 58-209875

[51] Int. Cl.⁴ ........................................... H01L 41/08
[52] U.S. Cl. ..................................... 310/328; 310/341
[58] Field of Search ................ 310/323, 328, 338, 26, 310/341, 342; 417/322, 410, 321

[56] References Cited

U.S. PATENT DOCUMENTS

| | | | |
|---|---|---|---|
| 3,194,162 | 7/1965 | Williams. | |
| 3,461,910 | 8/1969 | Selsam et al. | 310/328 X |
| 3,495,104 | 2/1970 | Burgo et al. | 310/325 |
| 3,501,099 | 3/1970 | Benson | 310/328 X |
| 3,598,506 | 8/1971 | O'Neill | 310/328 X |
| 3,700,937 | 10/1972 | Rissolo | 310/341 X |
| 3,822,388 | 7/1974 | Martini et al. | 310/328 X |
| 4,011,474 | 3/1977 | O'Neill | 310/328 |
| 4,471,256 | 9/1984 | Igashira et al. | 310/328 |

*Primary Examiner*—Mark O. Budd
*Attorney, Agent, or Firm*—Cushman, Darby & Cushman

[57] ABSTRACT

A piezoelectric actuator comprises a housing having an inside cavity in which is mounted a column of piezoelectric elements having interleaved electrodes. The column of piezoelectric elements is mounted within a sealed enclosure which divides the inside cavity of the housing into an inner space receiving the column of piezoelectric elements and an outer space. The inner space is filled with a flowable, electrically insulative, thermally conductive material such as silicone oil held in direct contact with and in a heat transfer relationship with the column of piezoelectric elements. The silicone oil serves to isolate the column of piezoelectric elements and the electrodes from moisture and other foreign materials that would otherwise affect an insulation breakdown voltage. A cooling liquid is adapted to be circulated through the outer space surrounding the enclosure to absorb heat transferred thereto from the column of piezoelectric elements through the flowable thermally conducting material. The piezoelectric actuator may be incorporated with a fuel injection nozzle to form a pump injector which pressurizes and injects fuel at each energization of the column of piezoelectric elements.

9 Claims, 3 Drawing Figures

PIEZOELECTRIC ACTUATOR AND A PIEZOELECTRIC PUMP INJECTOR INCORPORATING THE SAME

BACKGROUND OF THE INVENTION

1. Field of the Invention

The present invention relates to a piezoelectric actuator wherein piezoelectric elements are used as a drive source. This invention also relates to a piezoelectric pump injector incorporating such an actuator.

2. Description of the Prior Art

Already known in the art is the use of piezoelectric elements as a drive source of a high speed actuator designed to operate fuel injectors or control fuel injection systems of an internal combustion engine. As piezoelectric elements develop stress almost instantaneously upon application of an electric field, the use of a piezoelectric actuator enables the control of fuel injectors and fuel injection systems to be carried out with a more precise timing when compared with a mechanical actuator. Furthermore, a piezoelectric actuator may be electronically controlled by a computorized control unit so that the quantity of fuel injected may be controlled with a wider flexibility in dependence with various operating conditions of the engine.

In its simplest form, a piezoelectric actuator includes a hollow casing in which is mounted a column of piezoelectric elements. The column of piezoelectric elements generally comprises a plurality of thin piezoelectric disks of piezoelectric material numbering, for example, one hundred, and stacked one upon another with interleaved foil electrodes sandwiched therebetween. Each electrode is connected alternately to a plus lead line and a minus lead line. When an electric voltage of, for example, about 500 V, is applied between the plus and minus electrodes to produce an electric field across each piezoelectric disk, the latter expands in the direction of the thickness, thus displacing the free end of the column of piezoelectric elements in the axial direction. The axial displacement of the column end is taken to the outside of the actuator by means of an output mechanism such as an output rod or piston.

One of the problems of the prior art piezoelectric actuator is that breakdown of the insulation of the piezoelectric disks occurs when foreign materials such as moisture and electrically conductive particles are deposited on the periphery of the foil electrodes and piezoelectric disks. Moreover, the piezoelectric property of the piezoelectric material may be degraded if the temperature of the piezoelectric material becomes higher than the Curie point, due to a build-up of heat resulting from repeated high frequency energization of the piezoelectric element.

SUMMARY OF THE INVENTION

The object of the present invention is to provide a piezoelectric actuator having provision for effectively cooling the piezoelectric elements and capable of maintaining for an extended time period the electric insulation between the electrodes.

Toward this end, the present invention proposes to isolate the piezoelectric elements from the exterior environment by placing the piezoelectric elements within a sealed enclosure and filling the space between the enclosure and the piezoelectric elements with a flowable, electrically insulative, thermally conductive material, thereby preventing insulation breakdown, and in addition, to circulate a cooling medium around the enclosure to ensure effective cooling of the piezoelectric elements.

According to the present invention, there is provided a piezoelectric actuator comprising a hollow casing having an axial cavity, a column of piezoelectric elements received coaxially within the cavity and supported at an end by the casing, means for applying an electric field to the column of piezoelectric elements to develop piezoelectric stress therein to cause displacement of the other end of the column of piezoelectric elements, output means connected to the other end of the column of piezoelectric elements for transmitting the displacement of the other end of the column to the outside of the casing, an axially deformable enclosure fluid-tightly surrounding the column of piezoelectric elements and disposed between the casing and the column of piezoelectric elements to divide the casing cavity into an outer and an inner space, a flowable, electrically insulative, thermally conductive material filled in the inner space, and means for circulating a cooling medium through the outer space.

In one embodiment, the enclosure comprises a rigid tubular member and an end plate secured to the rigid tubular member at the side of the other end of the column of piezoelectric elements. The end plate is made flexible to permit flexural movement thereof in response to axial expansion and contraction of the column of piezoelectric elements, thereby allowing axial displacement of the other end of the column of piezoelectric elements.

In another embodiment of the invention, the enclosure comprises a substantially rigid tubular member closed at an end with a rigid eng plate, the tubular member having an annular corrugated portion capable of elastic deformation which will allow the other end of the column of piezoelectric elements to move in the axial direction in response to the application of the electric field.

In still another embodiment of the invention, the enclosure may comprise a flexible tubular member made, for example, from elastomer, and a liquid such as silicone oil may be used as the flowable, electrically insulative, thermally conductive material. Alternatively, electrically insulative, thermally conductive powders such as magnesium oxide powders may be charged within the enclosure as the flowable material.

Where the piezoelectric actuator is employed in a fuel injection system to constitute a fuel injection pump, it is advantageous to use fuel as the cooling madium.

The present invention also provides a piezoelectric pump injector incorporating a piezoelectric actuator. Thus, according to another aspect of the invention, there is provided a piezoelectric pump injector comprising a hollow housing having an axial bore closed at the ends, a column of piezoelectric elements received coaxially within the bore and supported at its upper end by the housing, means for applying an electric field to the piezoelectric elements to develop piezoelectric stress therein to cause displacement of the lower end of the column of piezoelectric elements, a pumping piston connected to the lower end of the column of piezoelectric elements and received slidably within the bore to define a pumping chamber therein, an axially deformable enclosure fluid-tightly surrounding the column of piezoelectric elements and arranged between the housing and the element to divide the space in the bore located above the piston into an outer space and sealed inner space, a flowable, electrically insulative, thermally conductive material filled in the inner space, means for circulating a cooling medium through the outer space, a fuel inlet passage having a check valve for supplying a fuel to the pumping chamber, a fuel injection nozzle mounted to the housing, and a fuel delivery passage in the housing for connecting the pumping chamber with the injection nozzle.

BRIEF DESCRIPTION OF THE DRAWINGS

Throughout the Figures, similar parts and members are indicated by like reference numerals.

DESCRIPTION OF THE PREFERRED EMBODIMENTS

Figure 1:
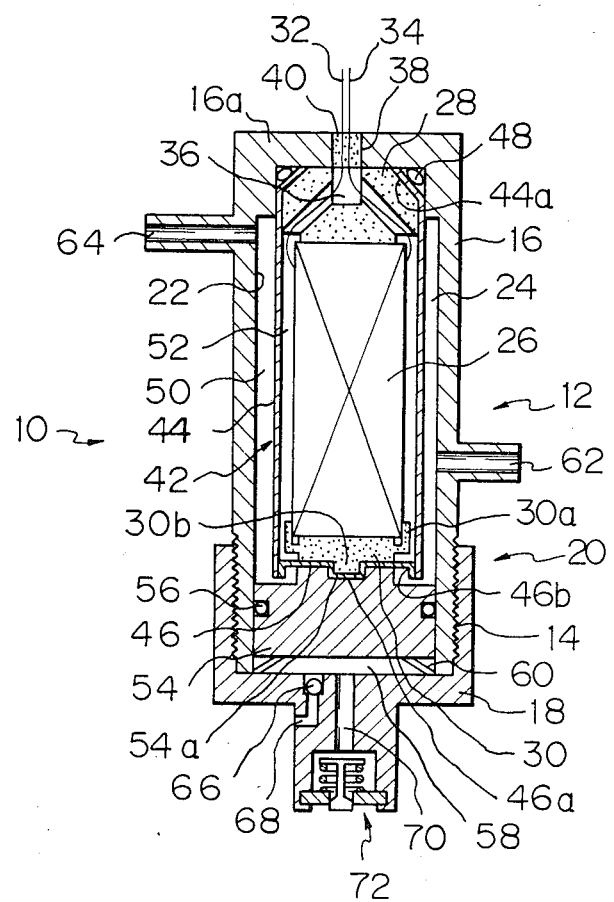
FIG. 1 is a schematic cross-sectional view of a pump injector incorporating a piezoelectric actuator according to the invention.

Referring to FIG. 1, there is shown a piezoelectric pump injector 10 incorporating an integral piezoelectric actuator 12 according to the invention. The pump injector 10 includes a hollow housing 20 having an upper housing part 16 and a lower housing part 18 coupled with each other by a threaded joint 14. The housing 20 serves as a casing for the piezoelectric actuator 12.

The upper housing 16 has a cylindrical stepped bore 22 defining a cavity 24 within the housing 20. A column of piezoelectric elements 26 is received within the cavity 24 and is sandwiched between a pair of spacers 28 and 30 made from an electrically nonconductive, noncompressible material such as ceramics. The column of piezoelectric elements 26 comprises a stack of thin piezoelectric disks made from a piezoelectric material such as lead zirconate titanate (PZT) and numbering, for example, about one hundred in total. The piezoelectric disks are compiled into a column with an interleaved foil electrodes (not shown) sandwiched between consecutive disks. The electrodes are connected alternately to a plus lead wire 32 and a minus lead wire 34 so as to apply an electric field across respective piezoelectric disks. The lead wires 32 and 34 are passed through a hole 36 in the upper spacer 28, through a plug 40 filled in an opening 38 formed in the top wall 16a of the upper housing part 16, and are then led to the outside of the housing.

The lower spacer 30 has an annular flange 30a for centering the lower part of the column of piezoelectric elements 26, the flange 30a being coaxial with the bore 22. The lower spacer 30 is provided with a downwardly extending stubby cylindrical central projection 30b.

The assembly of the column of piezoelectric elements 26 and spacers 28 and 30 is enveloped by an enclosure 42. In the illustrated embodiment, the enclosure 42 includes a rigid metal tube 44 and a flexible end plate 46 in the form of a diaphragm made of a thin metal sheet. The end plate 46 has at its center a downwardly projecting embossing 46a mating with the projection 30a of the lower spacer 30. The outer periphery of the end plate 46 is bent downward to form a flange 46b which is fitted within the tubular member 44 and is joined thereto by welding to form a hermetic seal. The upper end 44a of the metal tube 44 is crimped inwardly over the chamfered portion of the upper spacer 28, with an O-ring 48 compression-fitted between the upper spacer 28 and the upper housing part 16 to seal the gap therebetween. Thus, the cavity 24 in the housing 20 is divided by the enclosure 42 into an outer space 50 and a sealed inner space 52. A silicone oil is filled in the inner space 52 which is then closed by the plug 40.

Below the piezoelectric element and spacer assembly, a pumping piston 54 is slidably fitted within the bore 22. The piston 54 has an annular groove in which is mounted an O-ring 56. The pumping piston 54 defines a fuel pressurizing chamber or a pumping chamber 58 within the bore cavity. The piston 54 serves as a pumping piston to pressurize the fuel in the chamber 58 and as an output member for transmitting the displacement of the column of piezoelectric elements 26. A Belleville washer 60 seated on the lower housing part 16 urges the piston 54 through the end plate 46 and the lower spacer 30 against the column of piezoelectric elements 26, thereby preloading the column of prezoelectric elements 26 under compression. The piston 54 is provided at its upper surface with a central depression 54a mating with the embossing 46a of the end plate 46 for the purpose of centering the column of piezoelectric elements 26 with respect to the piston 54.

The upper housing part 16 has a fuel inlet 62 and a fuel outlet 64 for circulating a cooling fuel through the outer space 50.

The lower housing 18 has a fuel inlet passage 68 provided with a check valve 66 and leading to the pumping chamber 58 to supply the fuel thereto. The lower housing part 18 is also provided with a fuel delivery passage 70 leading from the pumping chamber 58 to a differential pressure type injection nozzle 72 provided at the lower end of the housing part 18.

Operation of the pump injector 10 is as follows. A fuel feed pump (not shown) pressurizes the fuel to several atmospheric pressures and feeds it through the inlet passage 68 and the check valve 66 into the pumping chamber 58. By properly adjusting the injection pressure of the injection nozzle to be larger than the feed pressure, fuel is not injected until the piezoelectric actuator 12 is energized. Upon applying an electric voltage in the order of plus 500 V between the lead wires 32 and 34, the column of piezoelectric elements 26 exhibits an axial expansion in the order of about 50 micrometers, causing the pumping piston to move downward against the action of the Belleville washer 60, pressurizing the fuel in the pumping chamber 58 to a pressure exceeding the injection pressure of the nozzle 72, whereby the fuel is injected through the injection nozzle. When application of the voltage is stopped the column of piezoelectric elements 26 contracts, permitting the piston 54 to move upward under the action of the washer 60 and thereby performing the suction stroke by which the fuel is drawn into the pumping chamber 58 through the inlet passage 68 and the check valve 66. On repeated energization of the actuator 12, the column of piezoelectric elements 26 becomes heated due to the heat build-up therein. However, the heat in the piezoelectric element 26 is transferred to the thermally conductive oil in the inner space 52 and is absorbed by the fuel flowing from the inlet 62 into the outer space 50 toward the outlet 64. The fuel flowing from a pressure regulator downstream of the feed pump may be used for circulation through the outer space 50.

It will be noted that if the cooling fuel is circulated in direct contact with the column of piezoelectric elements 26, there is a likelihood that a breakdown will occur at a lower voltage due to the moisture and foreign materials contained in the fuel. However, according to the invention, this is obviated by the presence of a layer of clean insulating oil surrounding the column of piezoelectric elements, preventing access of any moisture or foreign materials and ensuring that the reliability of the piezoelectric actuator and of the pump injector is considerably improved.

Figure 2:
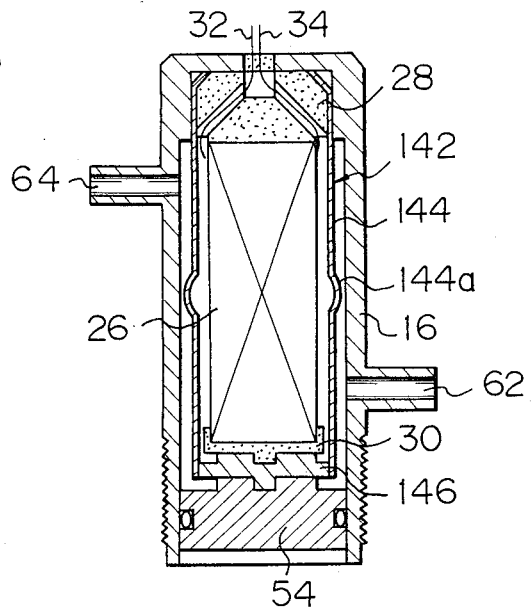
FIG. 2 is a schematic cross-sectional view of a second embodiment of the piezoelectric actuator according to the invention.

Referring to FIG. 2, there is shown a second embodiment of the piezoelectric actuator. In FIG. 2, the lower part of the housing is omitted from the drawing for simplicity. However, the actuator may be connected to the lower housing part as shown in FIG. 1 to form a piezoelectric pump injector. This embodiment differs from that shown in FIG. 1 in that the deformable enclosure 142 comprises a substantially rigid metal tube 144 having an annular corrugated portion 144a which affords an axial elasticity to the metal tube 144. The lower end of the metal tube 144 is bonded to a rigid end plate 146, whereas the upper end thereof is crimped to the upper spacer 28, as in the first embodiment. The operation of this embodiment is substantially the same as that of the first embodiment.

Figure 3:
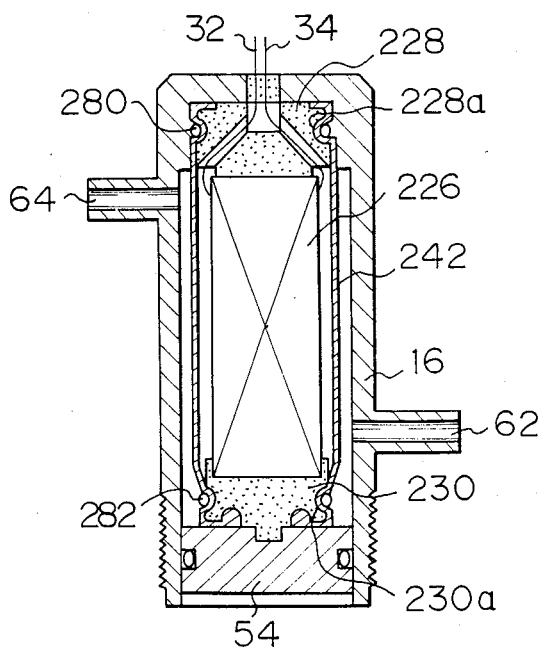
FIG. 3 is a schematic cross-sectional view of a third embodiment of the piezoelectric actuator according to the invention.

FIG. 3 shows a third embodiment of the piezoelectric actuator. The lower part of the housing is also omitted in this Figure. This embodiment differs from the preceding embodiments in that the enclosure 242 is made in the form of an elastomer tube such as a rubber tube. The upper and lower spacers 228 and 230 supporting the piezoelectric element 226 are provided with annular grooves 228a and 230a in which the ends of the rubber tube 242 are fitted radially inwardly by means of rubber rings 280 and 282. The advantage of this embodiment is that it can be readily manufactured, since the column of piezoelectric elements, spacers and enclosure are not assembled together by bonding or welding. The operation of the piezoelectric actuator according to this embodiment is substantially the same as that of the first embodiment.

While the present invention has been described herein with reference to the specific embodiments thereof, it is to be understood that various changes and modifications may be made thereto within the scope of the invention. For example, the piezoelectric actuator has been described and illustrated as forming an integral part of the pump injector. However, the actuator may be formed as a separate device detached from the injector. In that instance, the pumping piston may be replaced with a suitable output member such as an output shaft extending through the lower housing part to mechanically drive a driven member.

What is claimed is:

1. A piezoelectric actuator comprising:
   a hollow casing having an axial cavity;
   a column of piezoelectric elements received coaxially in said cavity and supported at an end by said casing;
   means for applying an electric field to said column of piezoelectric elements to develop piezoelectric stress therein causing displacement of the other end of said column of elements;
   output means connected to said other end of the column of piezoelectric elements for transmitting the displacement of said other end to the outside of said casing;
   an axially deformable enclosure fluid-tightly surrounding said column of piezoelectric elements and disposed at least in part between said casing and said column of piezoelectric elements to divide said cavity into an outer space and a sealed inner space;
   a flowable, electrically insulative, thermally conductive material filled in said inner space; and
   means for circulating a cooling medium through said outer space.

2. A piezoelectric actuator as defined in claim 1, wherein said enclosure comprises a rigid tubular member (44) and an end plate (46) secured to said tubular member at the side of said other end of said column of piezoelectric elements, said end plate (46) being flexible to permit displacement of said other end of the column of piezoelectric elements as said column of piezoelectric elements expands and contracts.

3. A piezoelectric actuator as defined in claim 1, wherein said enclosure comprises a substantially rigid tubular member (144) and a rigid end plate (146) secured to said tubular member at the side of said other end of said column of piezoelectric elements, said tubular member (144) having an annular corrugated portion (144a) capable of elastic deformation to permit displacement of said other end of the column of piezoelectric elements as said column of piezoelectric elements expands and contracts.

4. A piezoelectric actuator as defined in claim 1, wherein said enclosure comprises a flexible tubular member (242).

5. A piezoelectric actuator as defined in claim 4, wherein said flexible tubular member (242) is an elastomer tube.

6. A piezoelectric actuator as defined in claim 1, wherein said flowable, electrically insulative, thermally conductive material is silicone oil.

7. A piezoelectric actuator as defined in claim 1, wherein said flowable electrically insulative, thermally conductive material is powdered magnesium oxide.

8. A piezoelectric actuator as defined in claim 1, for use in a fuel injection system of an internal combustion engine, wherein the fuel in the injection system is circulated as said cooling medium.

9. A piezoelectric pump injector comprising:
   a hollow housing having an axial bore closed at the ends;
   a column of piezoelectric elements received coaxially within said bore and supported at the upper end by said housing;
   means for applying an electric field to said column of piezoelectric elements to develop piezoelectric stress therein causing displacement of the lower end of said column of piezoelectric elements;
   a pumping piston operatively connected to the lower end of said column of piezoelectric elements and received slidably within said bore to define a pumping chamber therein;
   an axially deformable enclosure fluid tightly surrounding said column of piezoelectric elements and disposed at least in part between said housing and said column of piezoelectric elements to divide the space in said bore located above said piston into an outer space and a sealed inner space;
   a flowable, electrically insulative, thermally conductive material filled in said inner space;
   means for circulating a cooling medium through said outer space;
   a fuel inlet passage including a check valve for supplying a fuel to said pumping chamber;
   an injection nozzle mounted to said housing; and
   a fuel delivery passage in said housing for connecting said pumping chamber with said injection nozzle.

* * * * *